(12) United States Patent
Hansford

(10) Patent No.: US 6,211,575 B1
(45) Date of Patent: *Apr. 3, 2001

(54) METHOD AND APPARATUS FOR IDENTIFYING CUSTOMIZED INTEGRATED CIRCUITS

(75) Inventor: Alan W Hansford, Austin, TX (US)

(73) Assignee: Sigmatel Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 34 days.

(21) Appl. No.: 09/376,503

(22) Filed: Aug. 18, 1999

(51) Int. Cl.$^7$ .................................................. H01L 21/44
(52) U.S. Cl. ........................... 257/786; 257/734; 257/780
(58) Field of Search ............................ 438/106; 257/734, 257/780, 786

(56) References Cited

U.S. PATENT DOCUMENTS 5,414,380 * 5/1995 Floyd et al. .
5,491,362 * 2/1996 Hamzehdoost et al. .
5,822,553 * 10/1998 Gifford et al. .

* cited by examiner

Primary Examiner—Kevin M. Picardat
Assistant Examiner—D. M. Collins
(74) Attorney, Agent, or Firm—Timothy W. Markison

(57) ABSTRACT

An integrated circuit having a unique identifying module includes a first and second bonding pads that are deposited on a die. The identifying module further includes a bond determining module that is operably coupled to the first and second bonding pads. As coupled, the bond determining module determines the bonding status of the first and second bonding pads. For example, the bonding status indicates whether a packaged pin is bonded to the first bonding pad, the second bonding pad, both bonding pads or neither bonding pad. Based on the bonding status, the bond determining module produces a die identifier which uniquely identifies the integrated circuit.

12 Claims, 6 Drawing Sheets

METHOD AND APPARATUS FOR IDENTIFYING CUSTOMIZED INTEGRATED CIRCUITS

TECHNICAL FIELD OF THE INVENTION

This invention relates generally to integrated circuits and more particularly to a technique for identifying customized integrated circuits.

BACKGROUND OF THE INVENTION

Few technological innovations have revolutionized technology as much as integrated circuits. Since the advent of integrated circuits, professional and consumer electronic products have become more sophisticated and smaller. As is known, integrated circuits allow complex circuitry to be implemented in extremely small packages. For example, such revolutionary integrated circuits include the microprocessor, video graphics circuits, audio Codec, memory, etc.

As integrated circuit technology continues to evolve, integrated circuit manufacturers are producing customized integrated circuits for particular clients. In many cases, the customized integrated circuit is similar to standard products with some customization for the particular client. For customized integrated circuits, the IC manufacturer typically includes identifying circuitry deposited on the die to identify the customized device. Such identifying circuitry typically is coupled to an exterior bonding pad of the die which in turn is coupled to a pin of the integrated circuit package. As such, when the integrated circuit is tested, a signal is applied to the testing pin, which is subsequently provided to the identifying circuitry on the die. If the signal is processed properly, the integrated circuit is identified as the customized integrated circuit. Such identifying circuitry may be as simple as a resistor having a known current applied across it, where the voltage is measured to identify the circuit. Alternatively, the identifying circuitry may be a register or a plurality of registers that store identifying bits wherein the bits are read from the registers via the package pin.

While such identifying circuitry works well to identify integrated circuits, they do require at least one package pin to be dedicated for the testing circuitry. As commercial demands are pushing integrated circuit manufacturers to make smaller integrated circuits in smaller packages, package pins are at a premium. As such, it is difficult if not impractical to dedicate a pin or pins to an integrated circuit identifying circuitry.

Therefore a need exists for a method and apparatus that utilize existing pins for identifying customized integrated circuits.

DETAILED DESCRIPTION OF A PREFERRED EMBODIMENT

Generally, the present invention provides an integrated circuit having a unique identifying module and a process for manufacturer thereof. The integrated circuit includes a first and second bonding pads that are deposited on a die. The identifying module further includes a bond determining module that is operably coupled to the first and second bonding pads. As coupled, the bond determining module determines the bonding status of the first and second bonding pads. For example, the bonding status indicates whether a packaged pin is bonded to the first bonding pad, the second bonding pad, both bonding pads or neither boding pad. Based on the bonding status, the bond determining module produces a die identifier which uniquely identifies the integrated circuit. With such a method of manufacturer and apparatus, an integrated circuit may be identified without the need for dedicated pins. As such, digital inputs and/or oscillating analog input pins may be utilized as the packaged pins that are coupled to the first and/or second bonding pad. Based on the particular bonding configuration, the integrated circuit can be uniquely identified.

Figure 1:
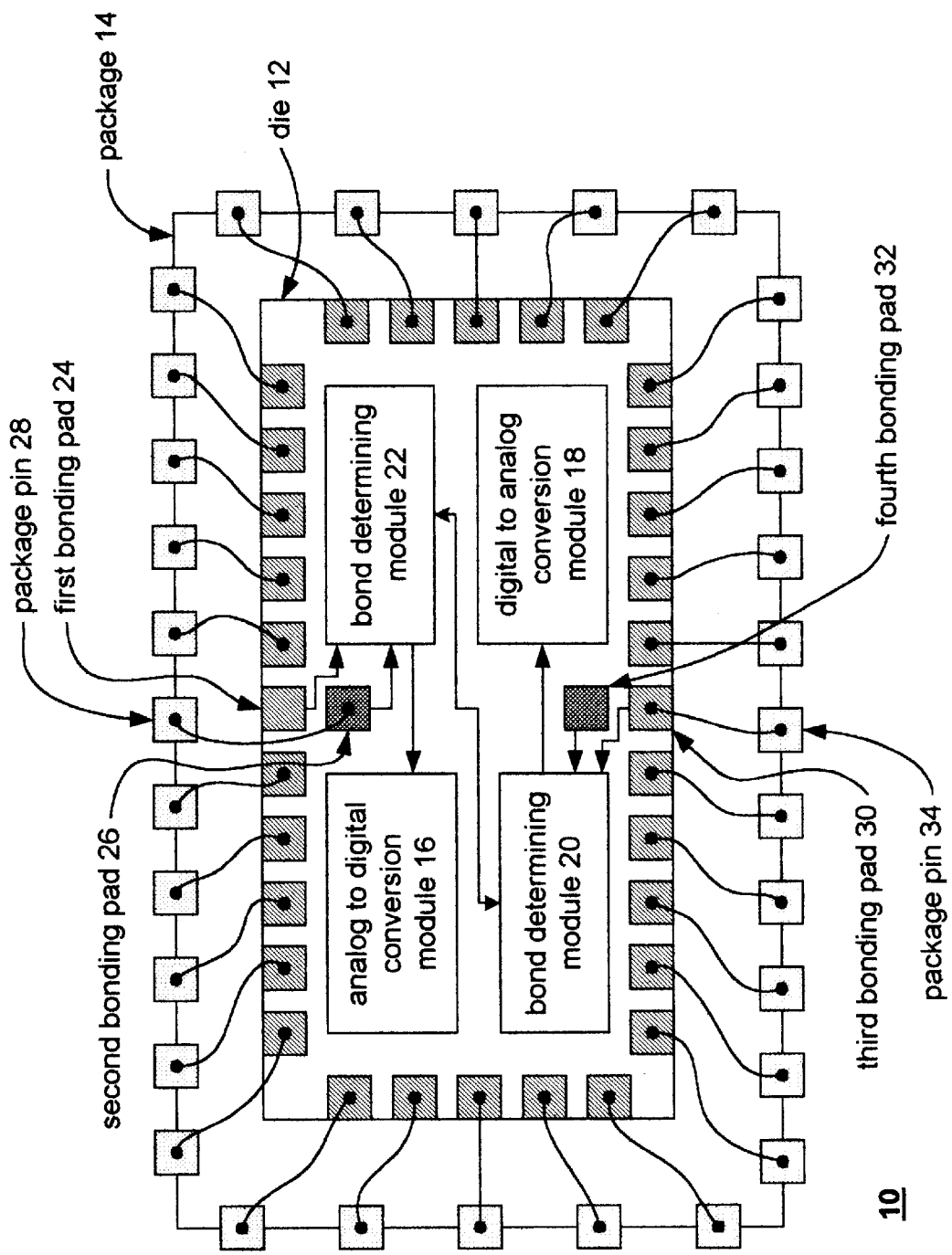
FIG. 1 illustrates a block diagram of an integrated circuit in accordance with the present invention.

The present invention can be more fully described with reference to FIGS. 1 through 6. FIG. 1 illustrates a graphic representation of an audio Codec 10 that includes a die 12 and a package 14. Deposited on the die 12 is a plurality of bonding pads, an analog to digital conversion module 16, a digital to analog conversion module 18, a first bond determining module 20 and a second determining module 22. The analog to digital conversion module 16 and the digital to analog conversion module 18 function in a similar manner as SigmaTel's audio Codec products having a part number of STAC9704, 9708, or 9721.

The die is shown to have a plurality of bonding pads at the perimeter of the die and two interior bonding pads 32 and 26. The interior bonding pads 26 and 32 are each associated with a perimeter bonding pads 24 and 30, respectively. In addition, the pair of bonding pads 24 and 26 and 30 and 32 are each associated with a package pin 28 and 34, respectively. Such a package pin is typically dedicated as an input signal to the analog to digital conversion module 16 and/or to the digital to analog conversion module 18. For example, the package pin 20 and/or 34 may be utilized as a clock input, a digital data input, an oscillatory analog input, and/or any input signal that has a fixed or variable period.

As shown, package pin 28 is bonded to the interior bonding pad 26, while package pin 34 is bonded to the exterior bonding pad 30. The respective bond determining modules 22 and 20 will interpret which of the bonding pads are bonded to the package pins to provide the unique integrated circuit identifier.

Figure 2:
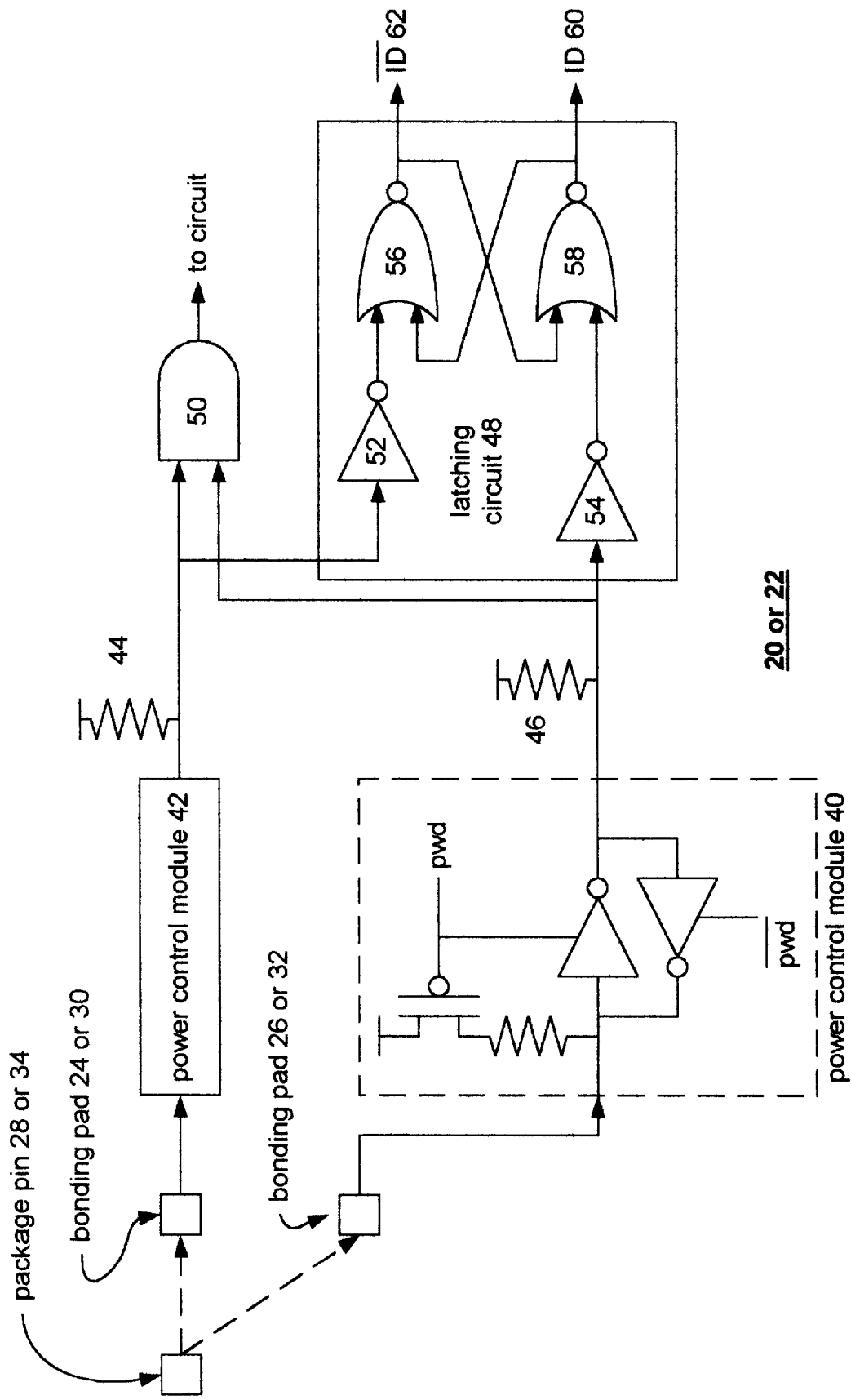
FIG. 2 illustrates a schematic block diagram of a bond determining module in accordance with the present invention.

FIG. 2 illustrates a schematic block diagram of the bond determining modules 20 and/or 22. The bond determining modules 20 and/or 22 include a power control modules 40 and 42, a latching circuit 48, impedance 44 and 46, and AND gate 50. The latching circuit 48 includes a pair of inverters 52 and 54 and a pair of NOR gates 56 and 58. In operation, the package pin 20 or 34 may be coupled to the first bonding pads 24 or 30 or the second bonding pad 26 or 32. When coupled to the first bonding pad 24 or 30, the input signal, which may be a clock signal, digital data, an/or oscillatory input signal, is provided through the power control module 42 to the AND gate 50 and also to the inverter 52 of latching circuit 48. Since bonding pad 26 or 32 is not coupled to the input signal, the impedance 46, which may be a resistor, pulls up on the input to inverter 54. In this configuration, one input to AND gate 50, via the pull up impedance 46, is high, while the other input is representative of the input signal. As such, the output of AND gate 50 is representative of the input provided on package pin 28 or 34.

The latching circuit 48 produces an identifying output 60 and an inverted identifying output 62. When pull-up impedance 46 is providing a logic one to the input of inverter 54, the output of inverter 54 is low. The output of inverter 52 would be the inversion of the input signal applied to pin 28 or 34. As the input on pin 20 or 34 toggles from a high to a low state, the output of inverter 52 toggles from a low to a high state. With the output of inverter 52 being high, the output of NOR gate 56 is low. As such, both inputs to NOR gate 58 are low thereby producing a logic one of the output of NOR gate 58. The output of NOR gate 58 is provided to the input of NOR gate 56 which will hold the output of NOR gate 56 low thereby latching the identifying signal 60 to a logic one and the inverted identifying signal 62 to a logic 0.

When the package pin 28 or 34 is coupled to the bonding pad 26 or 32, the opposite of the identifying signal 60 is a logic 0 while the inverted identifying signal 62 is a logic one. The illustrated embodiment of the bond determining module therefore produces a 1 bit identifying signal. As such, an integrated circuit that includes the bond determining module of FIG. 2 may have two unique configurations and corresponding unique identifying signals without the need for additional package pins to identify the integrated circuit. As one of average skill in the art would appreciate, the identifying signals produced at output 60 or 62 may be stored in a register that is subsequently available to be read by external circuitry via an output pin. Further note that the power control modules 40 and 42 are utilized to stabilize input signals during power transitions, i.e., power on and power off.

Figure 3:
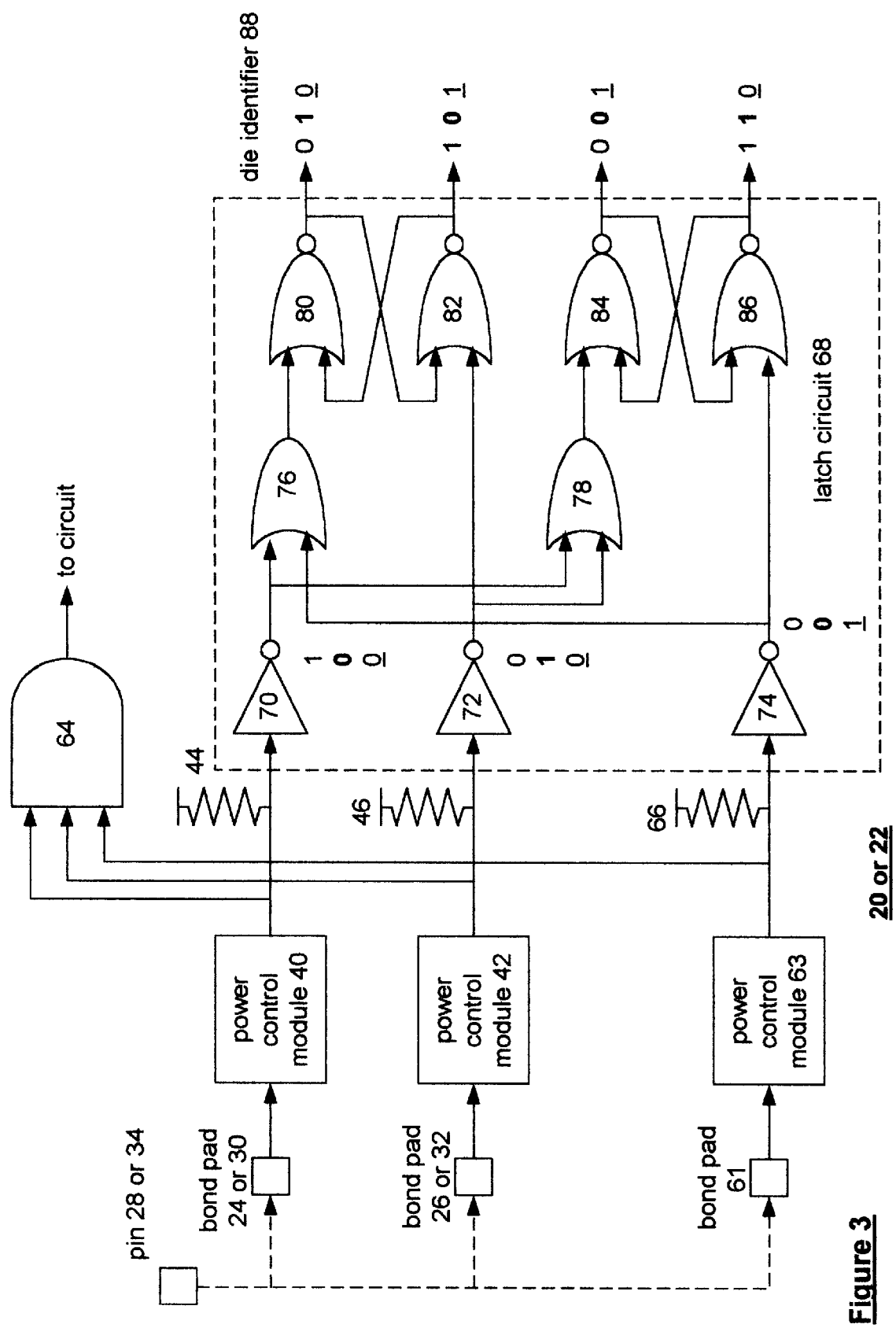
FIG. 3 illustrates a schematic block diagram of an alternate bond determining module in accordance with the present invention.

FIG. 3 illustrates a schematic block diagram of an alternate embodiment of the bond determining module 20 or 22. In this configuration, the integrated circuit includes three bonding pads that may be coupled to the package pin 28 through 34. Each of the bonding pads 24 or 30, 26 or 32, or 61, are coupled to corresponding power control modules 40, 42 or 60. The output of the power control modules are provided to an AND gate 64 and to the latch circuit 68. The latch circuit 68 includes three inverters 70, 72 and 74, a pair of OR gates 76 and 78 and four NOR gates 80, 82, 84 and 86.

The binary numbers shown affiliated with the latch circuit illustrate the different die identifiers 88 produced when the pin is coupled to the various bond pads. For example, when the pin is coupled to bond pad 24 or 30, the top set of binary numbers are utilized. As such, the output of inverter 70 is a logic 1, while outputs on inverter 72 and 74 are logic 0's. With these signals applied to OR gates 76 and 78 and to the NOR gates 80 through 86, the die identifier 88 includes the binary signals of 0101 at the outputs of NOR gates 80 through 86, respectively.

When pin 28 or 34 is operably coupled to the bonding pad 26 or 32, the output of inverter 72 is a logic 1, while the output as inverters 70 and 74 are logic 0's. For this configuration, the die identifier 88 includes a digital binary pattern of 1001 produced at the outputs of NOR gates 80 through 86. When the pin 28 or 34 is operably coupled to bond pad 60, the output of inverter 74 is a logic 1, which represents the toggling in accordance with the toggling of the signal provided on 10, 20 and 34. In this configuration, the outputs of inverter 70 and 72 are logic 0. With these signals, the die identifier 88 includes a binary patter of 0110. As one of average skill in the art would appreciated, the die identifier 88 does not need to include 4 bits of information. Alternatively, the die identifier may be produced with only 2 bits of information. For example, the output of NOR gate 80 and the output of NOR gate 84 may be utilized.

AND gate 64 is operably coupled to receive the outputs of each of the power control modules 40, 42 and 63. Irregardless of which bonding pad the pin is coupled to, the output of AND gate 64 will be representative of the signal applied to pin 28 or 34.

Figure 4:
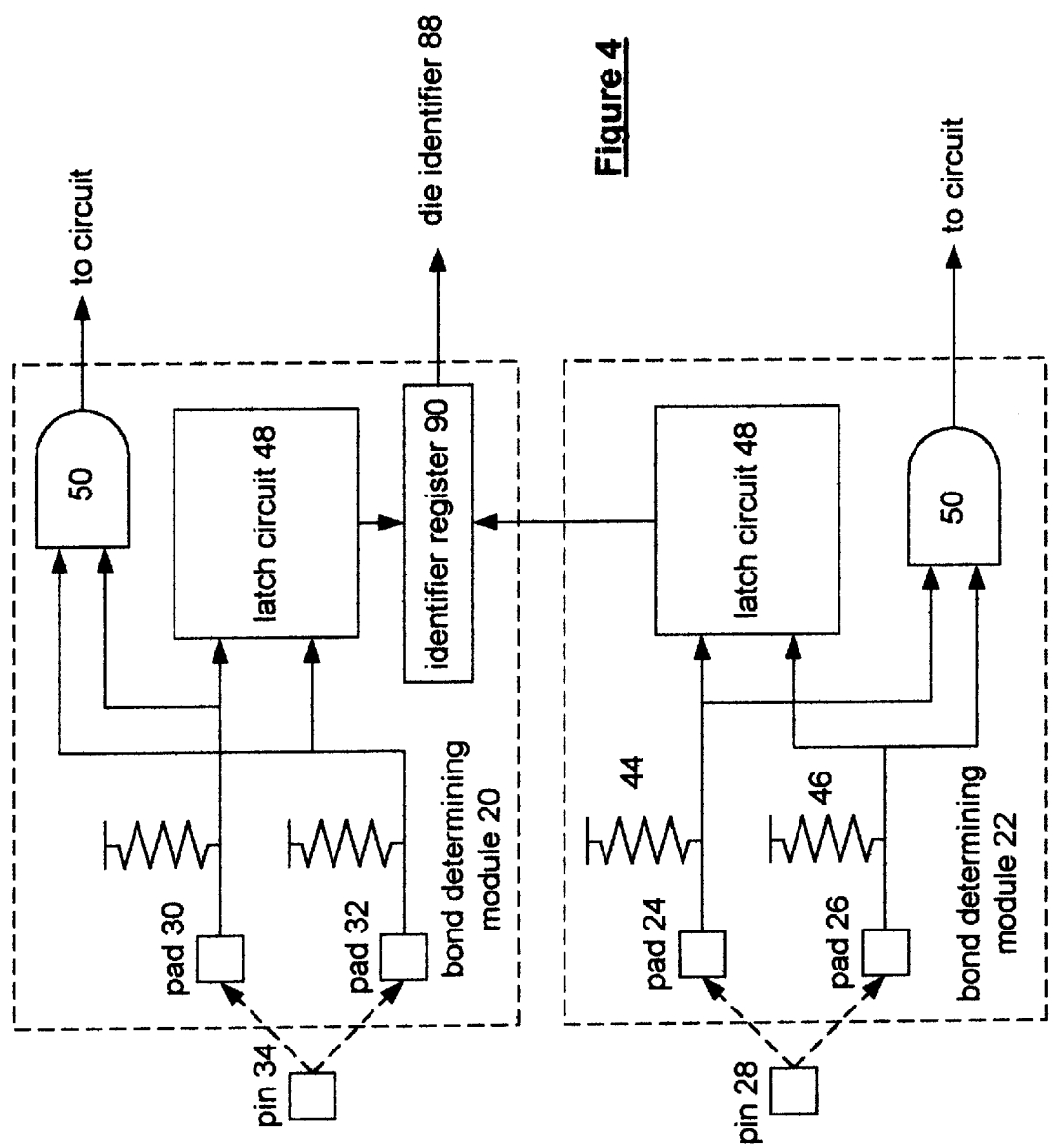
FIG. 4 illustrates a pair of bond determining modules in accordance with the present invention.

FIG. 4 illustrates a schematic block diagram of the bond determining modules 20 and 22 operably coupled to produce a die identifier 88. In this configuration, the circuitry of the bond determining modules is as shown in FIG. 2 with the addition of an identifying register 90. In this configuration, each of the input pins 28 and 34 is coupled to a corresponding one of the bonding pads 30 or 32, 24 or 26, respectively. As such, each latch circuit 48 produces a one bit identifying signal. Combining the one bit identifying signals, the die identifier 88 can be a two-bit signal. As such, in this configuration, four different integrated circuits may be represented by simply differing the bonding configurations with no impact other than a one gate delay on the operation of the circuit.

Figure 5:
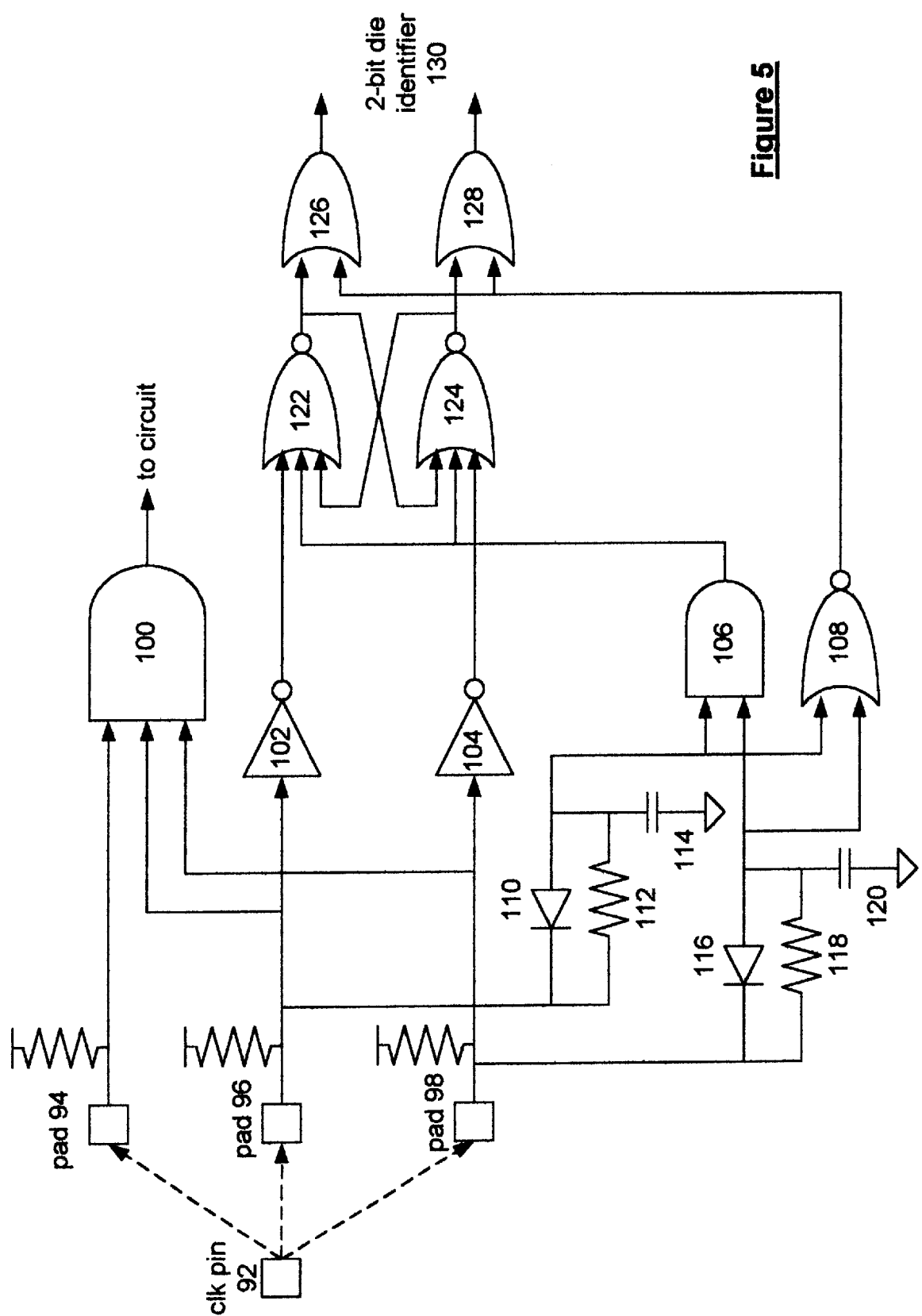
FIG. 5 illustrates a schematic block diagram of a yet another embodiment of the bond determining module in accordance with the present invention.

FIG. 5 illustrates a schematic block diagram of yet another embodiment of the bond determining module 20 or 22. In this configuration, a two-bit die identifier 130 is produced from a single input pin 92. The input pin 92 may be coupled to a clock signal, as shown, or to a data input signal wherein the data is encoded based on a clock signal wherein for each clock signal or group of clock signals the data signal transitions.

As shown, the input pin 92 may be coupled to one of three bonding pads 94 through 98. If the input pin 92 is coupled to bonding pad 94, the pads 96 and 98 are uncoupled as such, the pull-up resistors force the inputs to inverters 102 and 104 to be high. As such, the output of inverters 102 and 104 are low. In addition, the inputs to AND gate 106 are high causing the output of AND gate 106 to be high. With the output of AND gate 106 being high, which is an input to NOR gates 122 and 124, the outputs of each are 0. The inputs to NOR gate 108 are also both in a logic 1 state thereby producing a logic 0 state at its output. Thus, both inputs to OR gates 126 and 128 are in a logic 0 state thereby producing a 2 bit die identifier 130 of 00. As with the preceding circuits, the AND gate 100 receives the input signal via pad 94 and provides it to the circuit.

When the pin 92 is coupled to pad 96, the input will toggle from high to low and low to high in accordance with the clock signal applied thereto. As the output of inverter 102 toggles correspondingly. As such, the input to NOR gate 122 toggles.

Resister 112 and comparator 114 and resister 118 and comparitor 120 are sized to produce an RC time constant that is substantially greater than the frequency of the clock signal. As such, when the signal is toggling on pad 96, the capacitor 114 charges up slightly remaining in a logic 0 state and is discharged through diode 110 when the signal on pad 96 is low. As such, as long as the input signal on pad 96 is toggling, the voltage across capacitor 114 will remain in a logic 0 state. In the logic 0 state, AND gate 106 produces a 0 output. The inputs to NOR gate 108 are 0, which is represented by the voltage across capacitor 114, and a logic 1, which is represented by the voltage across capacitor 120. As such, the output of NOR gate 108 is a logic one. In this configuration, the NOR gates 122 and 124 will latch having an output with a logic 0 at the output of NOR gate 124 and a logic 1 at the output at NOR gate 122. With the output of NOR gate 108 being a logic 1, the output of OR gates 126 and 128 will be equal to the outputs of NOR gates 122 and 124. Thus, when the clock pin 92 is coupled to pad 96 the two-bit identifier will be a 10 output.

When the clock pin 92 is coupled to pad 98, the latching action of NOR gates 122 and 124 operate in the converse manner such that the output of NOR gate 124 is a logic 1 while the output of NOR gate is as logic 0. Thus the resulting 2 bit die identifier 130 is a 01.

When the clock pin 92 is coupled to both pads 96 and 98, the inputs to AND gate 106 and NOR gate 108 are low. As such, the output of AND gate 106 is a zero and the output of NOR gate 108 is a logic 1. With the output of NOR gate 108 being high, the output of NOR gates 126 and 128 will also be high thereby producing a 2 bit die identifier 130 of a binary value of 11.

Figure 6:
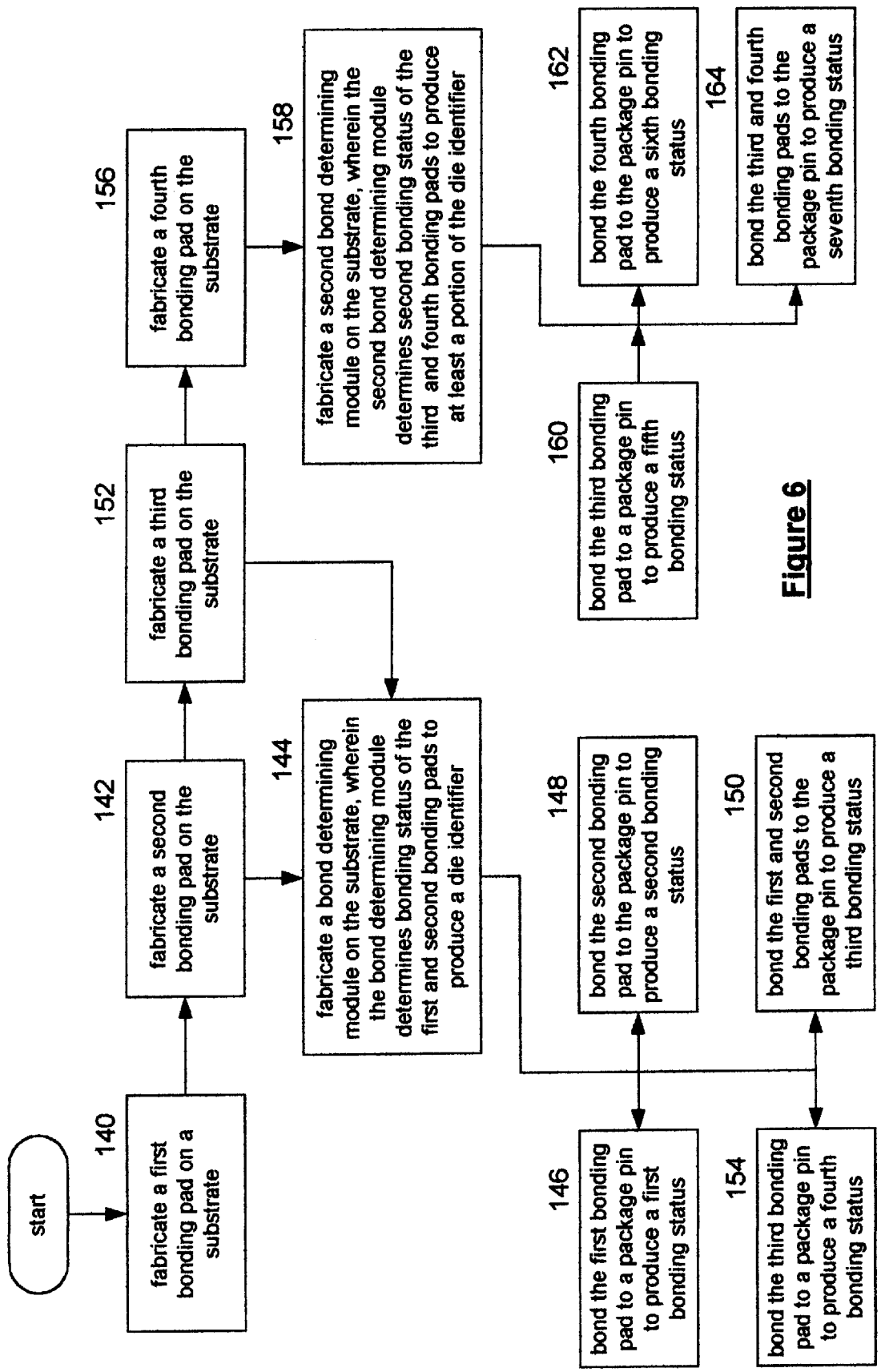
FIG. 6 illustrates a logic diagram of a method for identifying an integrated circuit in accordance with the present invention.

FIG. 6 illustrates a logic diagram of a method of fabricating an integrated circuit having an identifying module in accordance with the present invention. The process begins at step 140 where a first bonding pad is fabricated on a substrate. As is known, the substrate equates to a die which may be produced using a mask set to etch and/or deposit the circuitry on a wafer. The process then proceeds to step 142 where a second bonding pad is fabricated on the substrate. The process then branches to steps 144 and 152.

At step 144, a bond determining module is fabricated on the substrate. The bond determining module determines bonding status of the first and second bonding pads to a package pin to produce a die identifier. The process then branches to steps 146, 148, 154 and/or 150. At step 146, the first bonding pad is bonded to a package pin to produce a first bonding status. At step 148 the second bonding pad is bonded to the package pin to produce a second bonding status. If, the substrate also has a third bonding pad fabricated thereon, as indicated in step 152, steps 154 provides bonding the third bonding pad to the packaged pin to produce a fourth bonding status. At step 150, the first and second bonding pads may be bonded to the package pin to produce a third bonding status. The bonding status, which is used to determine the die identifier may be done in accordance with the circuits illustrated in FIGS. 2 through 5.

At step 156, a fourth bonding pad is fabricated on the substrate. Having done this, the process proceeds to step 158 where a second bond determining module is fabricated on the substrate. The second bond determining module determines second bonding status of the third and fourth bonding pads to produce at least a portion of the bond identifier. This was discussed with reference to FIG. 4. The process then proceeds to steps 162, 164 or 166. At step 160, the third bonding pad is bonded to a package pin to produce a fifth bonding status. At step 162, the fourth bonding pad is bonded to the package pin to produce a sixth bonding status. At step 164, the third and fourth bonding pads are bonded to the package pin to produce a seventh bonding status.

The preceding discussion has presented an identifying module and method of manufacturer therefore. By utilizing input pins that transport digital signals, clock signals, and/or oscillatory analog signals, an integrated circuit identifier may be generated without the need for extra pins or dedicated pins. As such, an integrated circuit manufacturer may produce integrated circuits that have unique identifiers without the need to dedicate package pins and without complex circuitry.

What is claimed is:

1. An identifying module for use in an integrated circuit, the identifying module comprises:
   a first bonding pad on a die;
   a second bonding pad on the die; and
   a bond determining module operably coupled to the first and second bonding pads, wherein the bond determining module determines bonding status of the first bonding pad and the second bonding pad, and wherein the bond determining module produces a die identifier based on the bonding status.

2. The identifying module of claim 1, wherein the bonding status includes at least one of the first bonding pad being bonded to a package pin, the second bonding pad being bonded to the package pin, the first and second bonding pads being bonded to the package pin, and neither the first or the second bonding pads being bonded to the package pin.

3. The identifying module of claim 1 further comprises a third bonding pad, wherein the bond determining module generates the die identifier based on the bonding status of the first, second, and third bonding pads.

4. The identifying module of claim 1 further comprises:
   a third bonding pad on the die;
   a fourth bonding pad on the die; and
   a second bond determining module operably coupled to the third and fourth bonding pads, wherein the second bond determining module determines second bonding status of the third bonding pad and the fourth bonding pad, and wherein the second bond determining module produces at least a portion of the die identifier based on the second bonding status.

5. The identifying module of claim 1, wherein the bond determining module comprises:
   a first impedance coupled to the first bonding pad;
   a second impedance coupled to the second bonding pad;
   a latching circuit operably coupled to the first and second bonding pads, wherein the latching circuit latches in a first state when the first bonding pad is bonded to a package pin and latches in a second state when the second bonding pad is bonded to the package pin.

6. The identifying module of claim 5, wherein the package pin supports a digital signal.

7. The identifying module of claim 1 further comprises an identifier register operably coupled to store the die identifier, wherein the identifier register is accessible external to the die.

8. An audio Codec integrated circuit comprises:
   analog to digital conversion module operably coupled to receive inbound analog signals and to produce therefrom inbound digital signals;
   digital to analog conversion module operably coupled to receive outbound digital signals and to produce therefrom outbound analog signals; and
   an identifying module that includes:
      a first bonding pad on a die;
      a second bonding pad on the die; and
      a bond determining module operably coupled to the first and second bonding pads, wherein the bond determining module determines bonding status of the first bonding pad and the second bonding pad, and wherein the bond determining module produces an audio Codec identifier based on the bonding status.

9. The audio Codec integrated circuit of claim 8, wherein the identifying module further comprises a third bonding pad, wherein the bond determining module generates the die identifier based on the bonding status of the first, second, and third bonding pads.

10. The audio Codec integrated circuit of claim 8, wherein the identifying module further comprises:

a third bonding pad on the die;

a fourth bonding pad on the die; and a second bond determining module operably coupled to the third and fourth bonding pads, wherein the second bond determining module determines second bonding status of the third bonding pad and the fourth bonding pad, and wherein the second bond determining module produces at least a portion of the die identifier based on the second bonding status.

11. The audio Codec integrated circuit of claim 8, wherein the bond determining module comprises:

a first impedance coupled to the first bonding pad;

a second impedance coupled to the second bonding pad;

a latching circuit operably coupled to the first and second bonding pads, wherein the latching circuit latches in a first state when the first bonding pad is bonded to a package pin and latches in a second state when the second bonding pad is bonded to the package pin.

12. The audio Codec integrated circuit of claim 8, wherein the identifying module further comprises an identifier register operably coupled to store the audio Codec identifier, wherein the identifier register is accessible external to the die.

* * * * *